United States Patent
Naito et al.

(10) Patent No.: US 6,472,259 B1
(45) Date of Patent: Oct. 29, 2002

(54) METHOD OF MANUFACTURING SEMICONDUCTOR DEVICE

(75) Inventors: Fumio Naito, Isehara; Hisaya Imai; Hidenori Mochizuki, both of Nobeoka, all of (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 0 days.

(21) Appl. No.: 09/701,633
(22) PCT Filed: Apr. 1, 1999
(86) PCT No.: PCT/JP99/01731
§ 371 (c)(1), (2), (4) Date: Dec. 1, 2000
(87) PCT Pub. No.: WO00/60661
PCT Pub. Date: Oct. 12, 2000

(51) Int. Cl.[7] .......................................... H01L 21/8238
(52) U.S. Cl. ...................... 438/201; 438/257; 438/275
(58) Field of Search ................................ 438/275, 201, 438/252

(56) References Cited

U.S. PATENT DOCUMENTS

| 4,851,361 | A | | 7/1989 | Schumann et al. | |
|---|---|---|---|---|---|
| 5,075,246 | A | | 12/1991 | Re et al. | |
| 5,550,072 | A | | 8/1996 | Cacharelis et al. | ........... 437/43 |
| 5,796,140 | A | * | 8/1998 | Tomioka | |
| 5,837,584 | A | * | 11/1998 | Lu et al. | |
| 5,962,889 | A | * | 10/1999 | Yamauchi et al. | |
| 5,963,808 | A | * | 10/1999 | Lu et al. | |
| 6,228,714 | B1 | * | 5/2001 | Choi | |

FOREIGN PATENT DOCUMENTS

| JP | 62-23150 | 1/1987 |
|---|---|---|
| JP | 62-76668 | 4/1987 |
| JP | 63-144577 | 6/1988 |
| JP | 4-119666 | 4/1992 |
| JP | 10-189783 | 7/1998 |
| JP | 11-111936 | 4/1999 |

* cited by examiner

*Primary Examiner*—Long Pham
(74) *Attorney, Agent, or Firm*—Finnegan, Henderson, Farabow, Garrett & Dunner, LLP (57) ABSTRACT

A method for manufacturing a semiconductor device comprising a nonvolatile memory transistor of a stacked gate structure having a floating gate and a control gate, and a MOS transistor of a single gate structure, wherein the method comprises the steps of forming a first insulation film that becomes a gate oxide film of the transistors on a semiconductor substrate; forming a first conductive layer on the first insulation film; removing, from the first conductive layer, a region for separating a floating gate in a direction perpendicular to a direction in which the control gate is formed extendedly; forming a second insulation layer on the first conductive layer; forming a second conductive layer on the second insulation film; patterning the second conductive layer so as to form the control gate; and patterning the first conductive layer to form the stacked gate structure and the single gate structure.

7 Claims, 11 Drawing Sheets

METHOD OF MANUFACTURING SEMICONDUCTOR DEVICE

FIELD OF THE INVENTION

The present invention relates to a method of manufacturing a nonvolatile semiconductor memory device. More specifically, the present invention relates to a method of manufacturing a semiconductor device comprising a nonvolatile memory transistor of a stacked gate structure having a floating gate and a control gate, and a MOS transistor of a single gate structure.

DESCRIPTION OF THE RELATED ART

A method for manufacturing EEPROM having a high-voltage transistor (for example, a MOS transistor is available) is described in, for example, U.S. Pat. No. 4,851,361. According to this ordinary method, an active region is formed in a semiconductor substrate, a thin tunnel region of a nonvolatile memory cell is formed on the semiconductor substrate, and a first polysilicon layer is then deposited on the whole surface of the semiconductor substrate. Subsequently, the first polysilicon layer is processed to form a floating gate electrode of the nonvolatile memory cell. Further, after a capacitive insulation film, a gate oxide film of a high-voltage transistor and a gate oxide film of a logic circuit portion are formed, a second polysilicon layer is deposited on the whole surfaces of the oxide films. And this second polysilicon layer is processed to form a control gate of the memory cell, a gate electrode of the high-voltage transistor and a gate electrode of the logic circuit.

SUMMARY OF THE INVENTION

However, in the above ordinary method of manufacturing the semiconductor device comprising the nonvolatile memory cell such as EEPROM and the logic circuit, there is a difference in level in the deposited second polysilicon layer, which is due to the first polysilicon layer. As a result, there is a need for removing the second polysilicon deposited on the side wall of the difference due to the first polysilicon layer. Thus, conditions have to be set such that side etching occurs by conducting excess etching. In this case, however, the dimensional accuracy of the gate formed by the second polysilicon layer is decreased, and it is difficult to form a fine gate.

Further, since the gate oxide film of the high-voltage transistor and the gate oxide film of the logic circuit portion are formed simultaneously, the gate oxide film has to be formed relatively thick, and it is hard to finely process the logic circuit portion. Therefore, there would be a method in which the gate oxide film of the high-voltage MOS transistor is formed relatively thick and the gate oxide film of the logic circuit portion is formed relatively thin. Nevertheless, this method is undesirable, since the number of steps is increased.

Under the circumstances, one of the objects of the invention is to provide a method of manufacturing a semiconductor device comprising a nonvolatile memory cell such as EEPROM and a logic circuit, in which a finer gate electrode is formed in the logic circuit portion without increasing the number of steps.

The first aspect of the invention is a method for manufacturing a semiconductor device comprising a nonvolatile memory transistor of a stacked gate structure having a floating gate and a control gate, and a MOS transistor of a single gate structure. The method comprises the steps of:

forming a first insulation film on a semiconductor substrate, said first insulation film becoming a gate oxide film of both the nonvolatile memory transistor and the MOS transistor;

forming a first conductive layer on the first insulation film;

removing an area extending in a direction perpendicular to a direction in which the control gate is formed extendedly from the first conductive layer to form a region for separating the floating gate;

forming a second insulation layer on the first conductive layer;

forming a second conductive layer on the second insulation film;

patterning the second conductive layer so as to form the control gate; and patterning the first conductive layer to form the stacked gate structure and the single gate structure.

The second aspect of the invention is the method for manufacturing the semiconductor device as described in the first aspect, wherein the MOS transistor of the single gate structure includes a high-voltage transistor and a MOS transistor forming a peripheral circuit.

The third aspect of the invention is the method for manufacturing the semiconductor device as described in the second aspect, wherein the step of forming the first insulation film comprises the steps of forming a gate insulation film of a high-voltage transistor, and forming a tunnel oxide film between the floating gate and the substrate and simultaneously forming a gate insulation film of the MOS transistor forming the peripheral circuit.

The fourth aspect of the invention is the method for manufacturing the semiconductor device as described in the first aspect, wherein the floating gate is patterned in self-alignment manner using the second conductive layer constituting the control gate as a mask, in the step of patterning the first conductive layer to form the stacked gate structure.

The fifth aspect of the invention is the method for manufacturing the semiconductor device as described in the first aspect, wherein the first conductive layer and the second conductive layer are made of polysilicon The sixth aspect of the invention is the method for manufacturing the semiconductor device as described in the first aspect, wherein the method further comprises a step of forming a side wall on the side surface of the control gate after patterning the second conductive layer.

The seventh aspect of the invention is the method for manufacturing the semiconductor device as described in the fifth aspect, wherein the method further comprises a step of forming a first metal silicide layer on the second conductive layer.

The eighth aspect of the invention is the method for manufacturing the semiconductor device as described in the seventh aspect, wherein the method further comprises the steps of:

forming a third insulation film on the first metal silicide layer;

removing the third insulation film, the first metal suicide layer, the second conductive layer and the second insulation film except the control gate portion of the stacked gate structure to form the control gate portion;

forming a side wall on the control gate portion;

forming a second metal silicide layer on the first conductive layer and the third insulation film exposed;

forming a fourth insulation film on the second metal suicide layer; and etching the first conductive layer using the control gate portion as a mask to form the stacked gate structure in self-alignment manner, while patterning the fourth insulation film, the second metal silicide layer, and the first conductive layer to form the MOS transistor of the single gate structure.

The ninth aspect of the invention is a method for manufacturing a semiconductor device having a nonvolatile memory cell, a capacitor and/or a resistance, and a logic circuit, which method comprises the steps of;

simultaneously forming a tunnel oxide film of the memory cell and a gate oxide film of a MOS transistor of the logic circuit;:

forming a first polysilicon layer on the whole surface of the oxide film;

removing a region for separating a floating gate of the memory cell of the first polysilicon layer;

forming a first insulation film on the first polysilicon layer;

forming a second polysilicon layer on the whole surface of the first insulation film;

forming a second insulation film on the second polysilicon layer;

removing the second insulation film, the second polysilicon layer and the first insulation film except the desired region of the memory cell and the upper electrode region of the capacitor;

forming a third insulation film on the whole surface;

removing the portions of the third insulation film except the lower electrode region of the capacitor and the region of the resistance; and anisotropically etching the whole surface to form a side wall of a stacked gate of the memory cell.

BRIEF DESCRIPTION OF THE DRAWINGS

FIGS. 1 to 13 are views describing a method for manufacturing a semiconductor device which is the first embodiment of the present invention.

FIGS. 14 to 23 are views describing a method for manufacturing a semiconductor device which is the second embodiment of the present invention.

FIGS. 25 and 26 are views describing a method of manufacturing a semiconductor device which is the third embodiment of the invention.

BEST MODE FOR CARRYING OUT THE INVENTION

The first embodiment of the method for manufacturing the semiconductor device in the present invention is illustrated with reference to FIGS. 1 to 13. This first embodiment corresponds to the first to sixth aspects of the present invention. This method is a method for manufacturing a semiconductor device comprising a nonvolatile memory cell such as EEPROM and a MOS transistor together. The nonvolatile memory cell has a stacked gate, in which a floating gate and a control gate are stacked on a tunnel oxide film via an insulation film, and a selection gate consisting of a high voltage transistor for selecting a desired stacked gate. The nonvolatile memory cell stores data upon controlling a threshold voltage of the transistor of the stacked gate by forcedly injecting charge through the tunnel oxide film. Alternatively, a circuit which consists of a high-voltage transistor and which generates a high voltage and controls the same is sometimes built therein. Since the method of the present invention is especially characterized by the formation of the gate, the description about formation of known channel, source, and drain in an active region is omitted.

Figure 1:
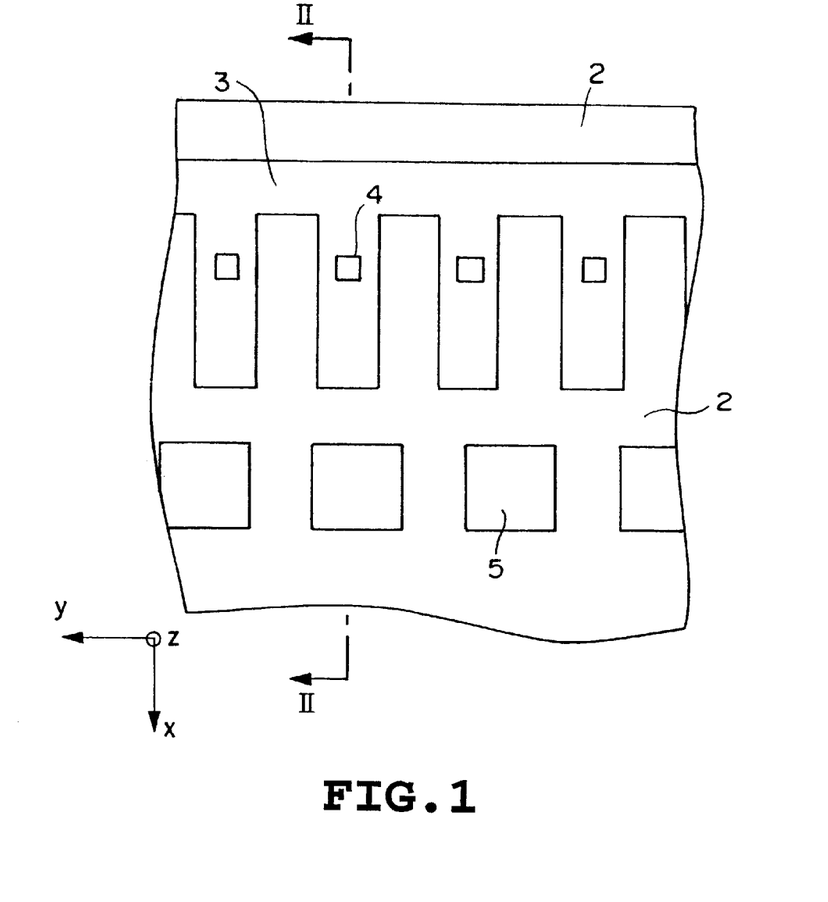
FIG. 1 is a top view of a semiconductor substrate 1 in which a field oxide 2, a relatively thick gate oxide film 3, and a tunnel oxide film 4 are formed on a surface thereof.
Figure 2:
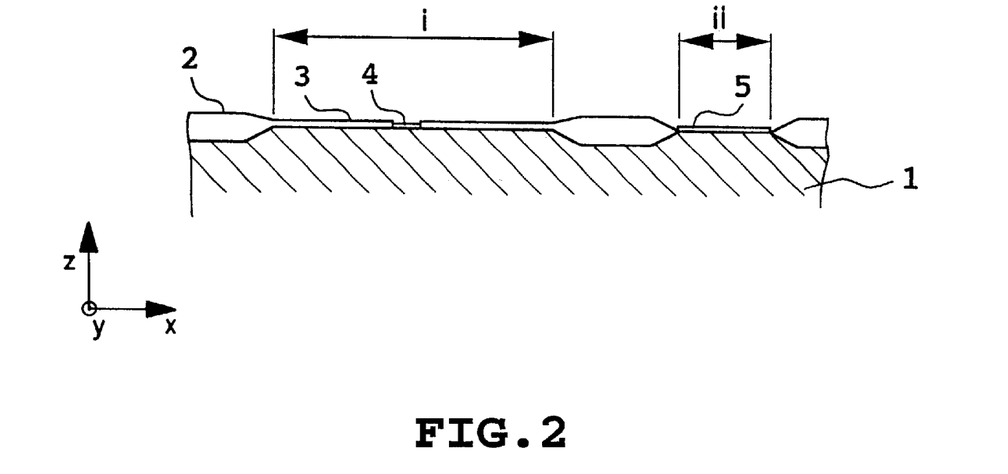
FIG. 2 is a sectional view taken on line II—II shown in FIG. 1.

FIG. 1 is a top view in which a field oxide 2, a relatively thick gate oxide film 3, and a tunnel oxide film 4 are formed on a surface of a semiconductor substrate 1. FIG. 2 is a sectional view taken on line II—II shown in FIG. 1. In this stage, a source and a drain that becomes a memory, and channel regions of a stacked gate, a selection gate, and a MOS transistor are already formed. However, they are not shown for maintaining clarity of drawings.

First, the field oxide 2 and the relatively thick gate oxide film 3 are formed by thermal oxidation. For example, the thickness of the field oxide film 2 is 450 nm, and the thickness of the gate oxide film 3 is 41.5 nm. Subsequently, the gate oxide film 3 in a position corresponding to the tunnel oxide film 4 of the nonvolatile memory cell and in a position corresponding to the gate oxide film 5 of the logic circuit is removed by etching. Further, the tunnel oxide film 4 and the gate oxide film 5 of the MOS transistor are formed to a thickness of 10 nm respectively. In FIG. 2, a region "i" is a region of the nonvolatile memory cell, and a region "ii" is a region of the MOS transistor.

Figure 3:
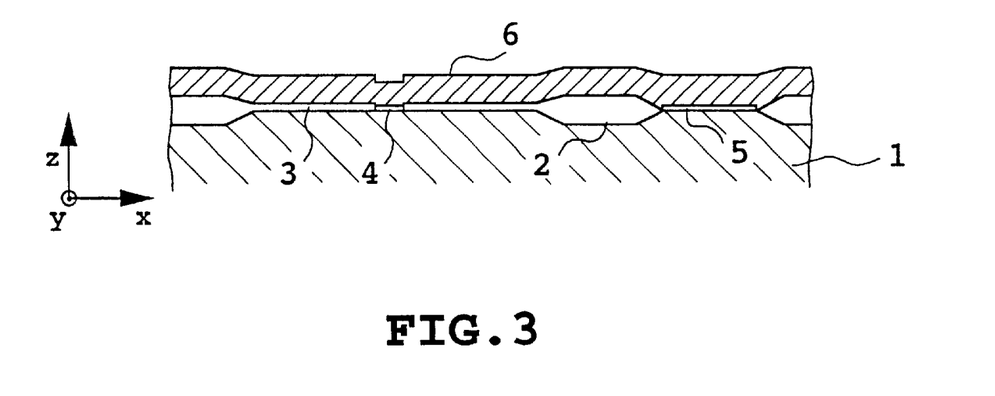
FIG. 3 is a view in which a polysilicon layer 6 is deposited on the whole surface of the substrate as a first conductive layer.
Figure 4:
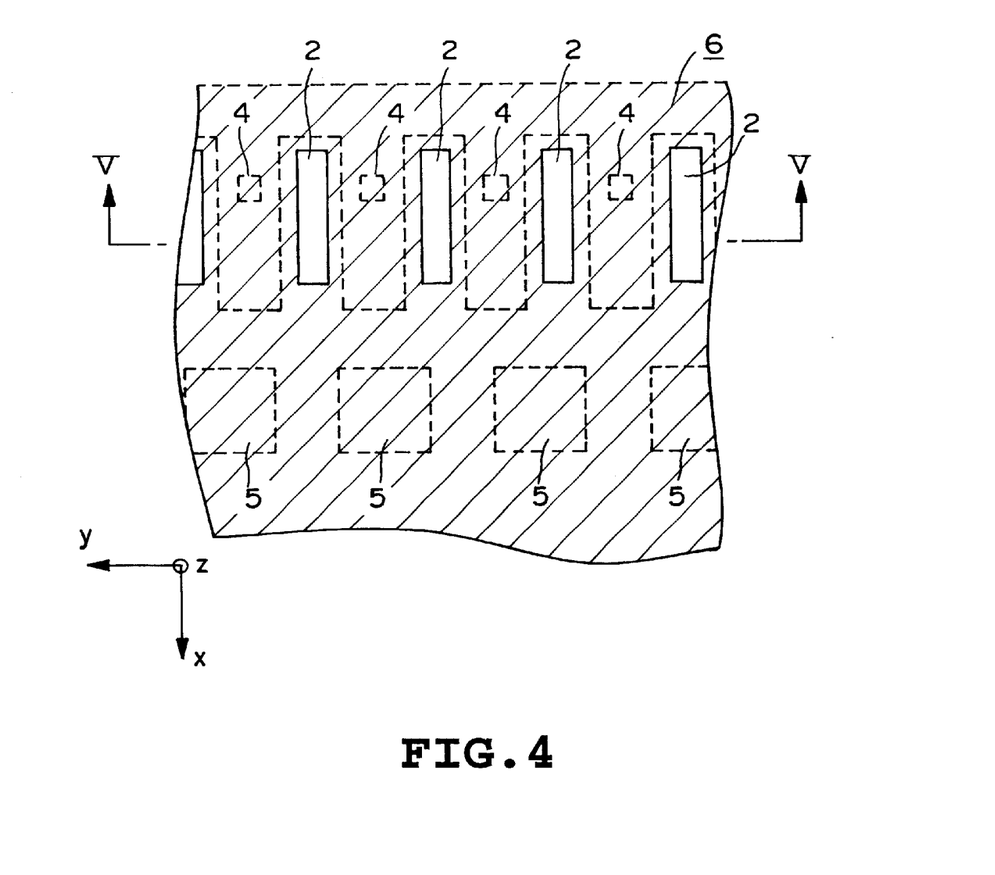
FIG. 4 is a top view showing a structure in which a polysilicon layer 6 in a predetermined position is removed by etching.
Figure 5:
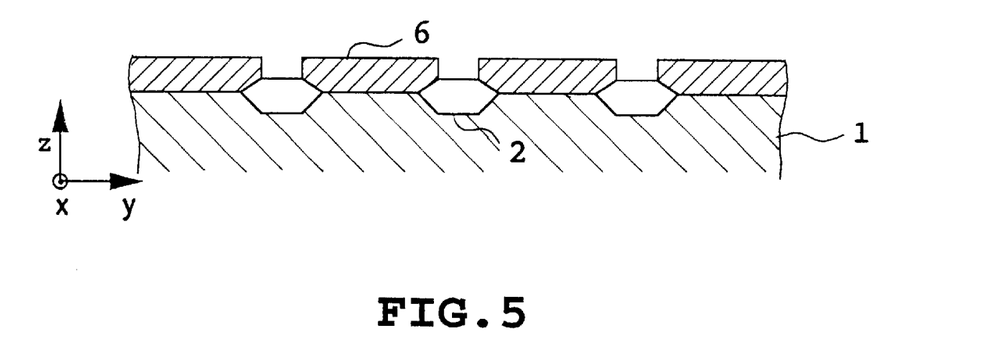
FIG. 5 is a sectional view taken on line V—V shown in FIG. 4.

FIG. 3 is a view in which a polysilicon layer 6 is deposited on the whole surface of the substrate as a first conductive layer. Then, the polysilicon layer 6 forming the floating gate of the nonvolatile memory cell is separated. FIG. 4 is a top view showing a structure in which the polysilicon layer 6 in a predetermined position is removed by etching. FIG. 5 is a sectional view taken on line V—V shown in FIG. 4. This sectional line is perpendicular to the sectional line in FIG. 1. The drawing shows that a predetermined position of the polysilicon layer 5 is etched to form a groove and the field oxide 2 is exposed on the bottom of the groove. The groove is formed only in a direction x perpendicular to a direction y in which a control gate is extendedly formed later. Unless this groove is formed, the floating gate cannot be separated in a subsequent step when the control gate is extendedly formed continuously.

Figure 6:
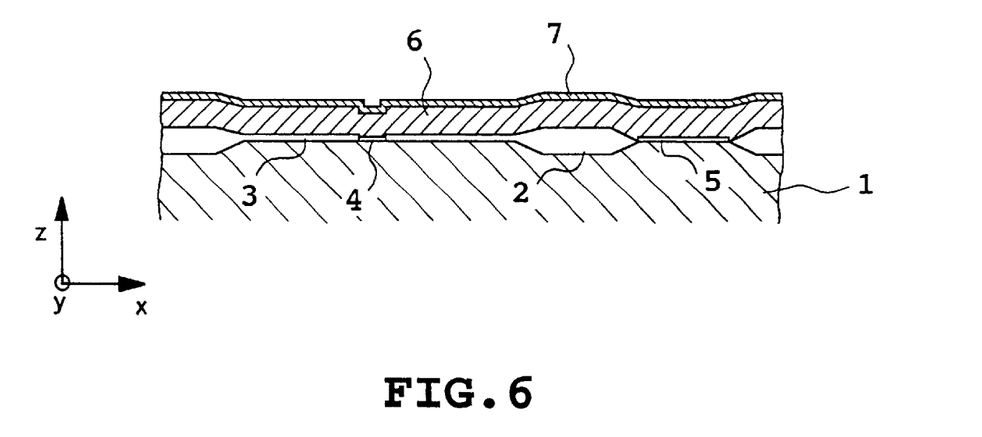
FIG. 6 is a sectional view showing that a first insulation film is formed on the polysilicon layer 6.

FIG. 6 is a sectional view showing that a first insulation film is formed on the polysilicon layer 6. An insulation film 7 is formed on the polysilicon layer 6 as a three-layer structure of $SiO_2$, $Si_3N_4$, and $SiO_2$ (hereinafter referred to as an "ONO film").

Figure 7:
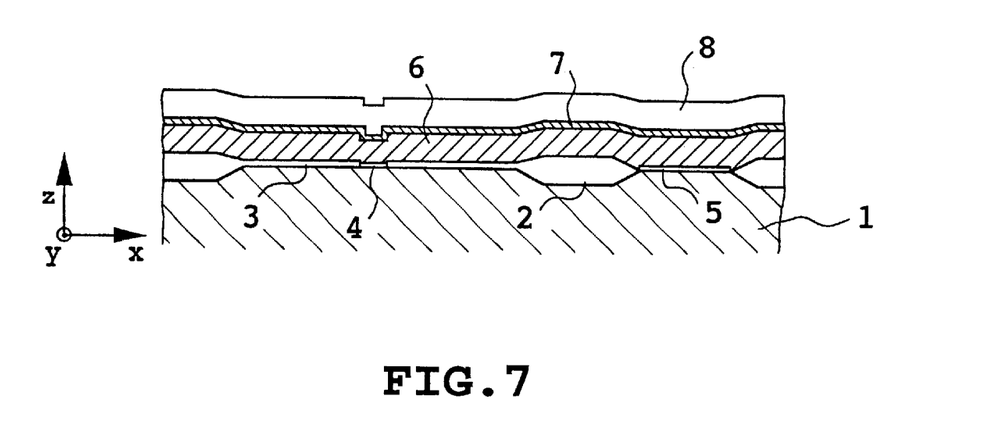
FIG. 7 is a sectional view showing that a second conductive layer is formed on a first insulation film 7.

FIG. 7 is a sectional view showing that a second conductive layer is formed on the first insulation film 7. A polysilicon layer 8 is deposited as the second conductive layer.

Figure 8:
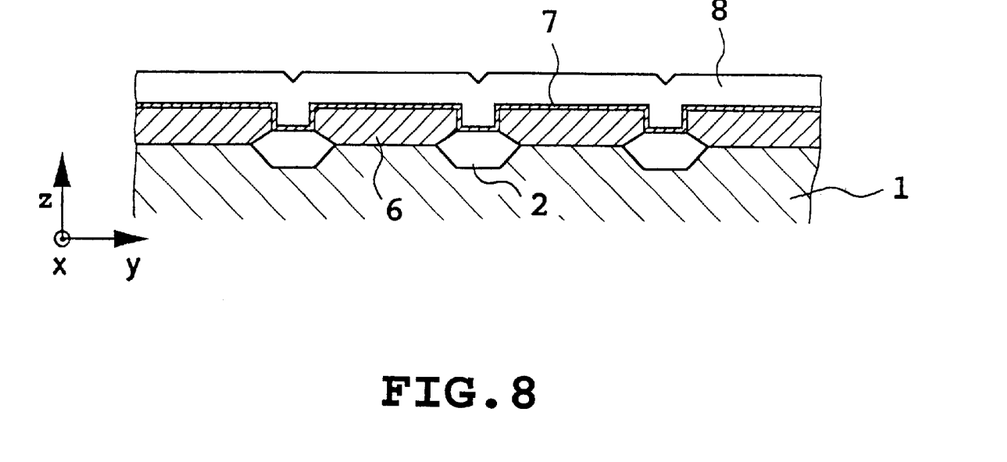
FIG. 8 is a sectional view of the stage shown in FIG. 7, taken on line corresponding to the line V—V in FIG. 4.

FIG. 8 is a sectional view taken on line corresponding to the line V—V in FIG. 4, in which the polysilicon layer 8 is formed.

Figure 9:
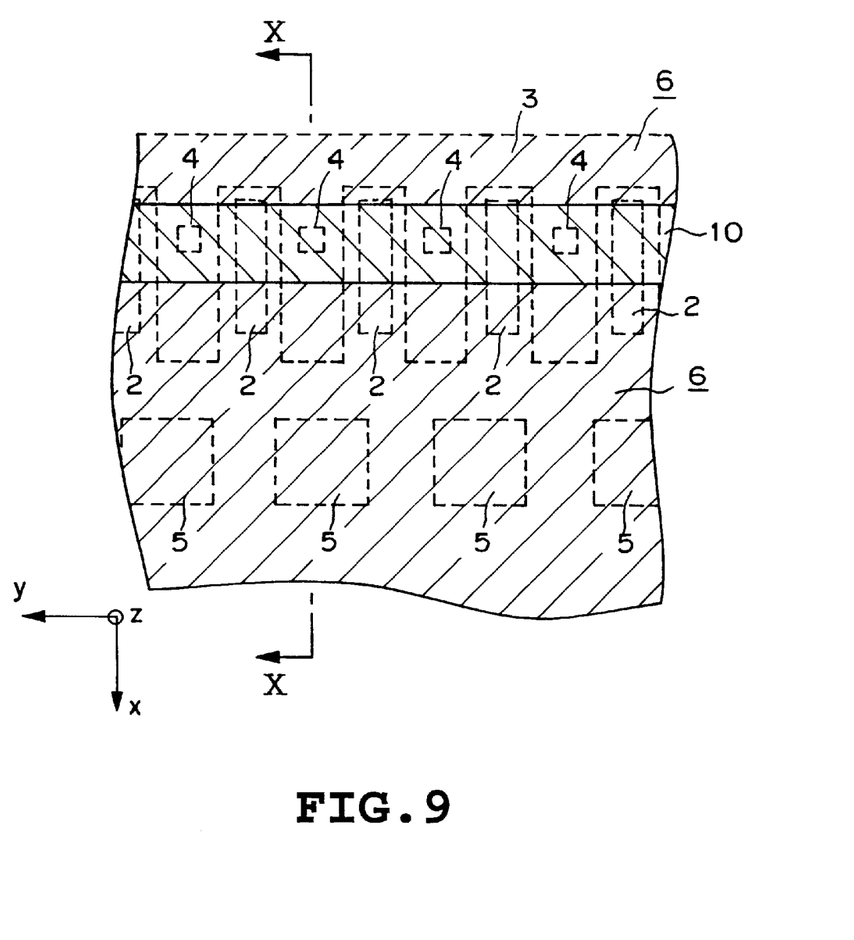
FIG. 9 is a sectional view showing that a control gate 11 is formed on a portion corresponding to a stacked gate.
Figure 10:
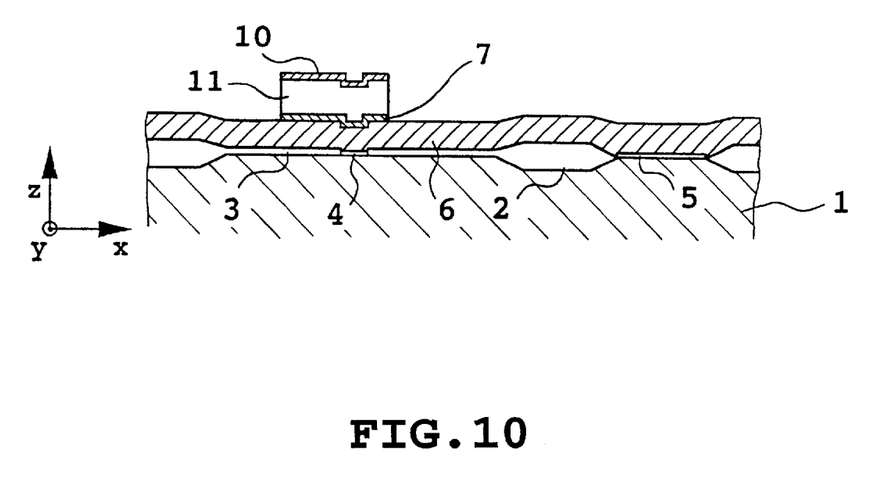
FIG. 10 is a sectional view taken on line X—X shown in FIG. 9.

FIG. 9 is a top view showing that a control gate is formed on a portion corresponding to the stacked gate, and FIG. 10 is a sectional view taken on line X—X shown in FIG. 9. In these drawings, an insulation film 10 is formed on the whole surface of the polysilicon layer 8, a mask is further provided on a portion corresponding to the stacked gate of the nonvolatile memory cell, and the second insulation film 10, the polysilicon layer 8 and the first insulation film 7, except the portion corresponding to the stacked gate, are removed by reactive ion etching to form a polysilicon layer (control gate) 11.

Figure 11:
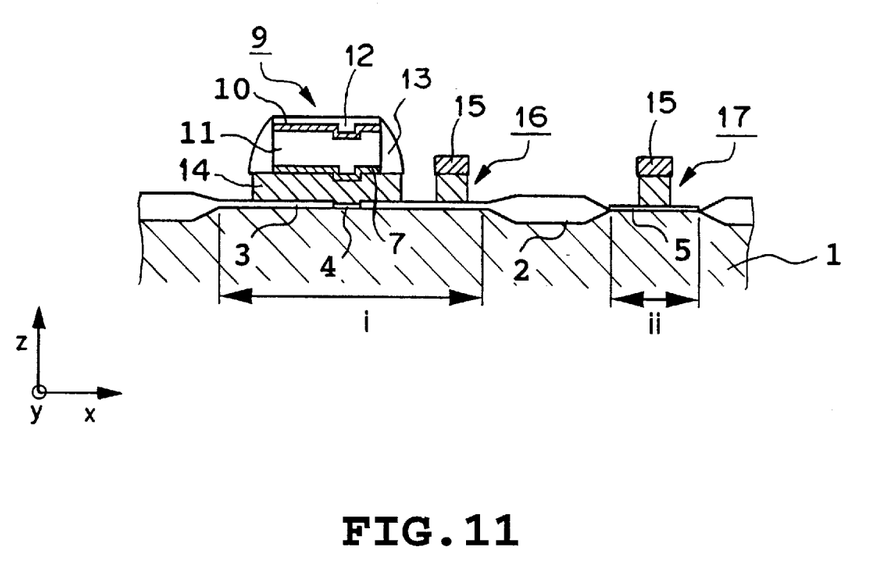
FIG. 11 is a sectional view of a semiconductor device manufactured by the first embodiment of the present invention.

Subsequently, an insulation film 12 is deposited, and the whole surface is subjected to reactive ion etching to form a side wall 13 on the side of the control gate 11. The polysilicon layer 6 is then etched using this side wall to form a floating gate 14 composing a part of the stacked gate of the nonvolatile memory cell in self-alignment manner. In the etching for forming the floating gate 14, a selection gate 16 of the nonvolatile memory cell and a gate electrode 17 of the MOS transistor can be formed simultaneously. First, an insulation film 15 is deposited, and masks are then provided on portions corresponding to the selection gate of the nonvolatile memory cell and the gate electrode of the MOS transistor. By using these masks, the insulation film 12 and the sidewall 13 as etching masks, the insulation layer 15 and the polysilicon layer 6, are etched to form a selection gate electrode 16 of the nonvolatile memory cell and a gate electrode 17 of the MOS transistor along with the floating gate 14. Then, the masks in positions corresponding to the selection gate of the nonvolatile memory cell and the gate of the MOS transistor are removed. Subsequently, the source and the drain of the selection gate and the MOS transistor are formed by a known method. A sectional view of the semiconductor device manufactured in this manner is shown in FIG. 11, wherein: "i" is the nonvolatile memory cell region, and "ii" is the MOS transistor region.

Figure 12:
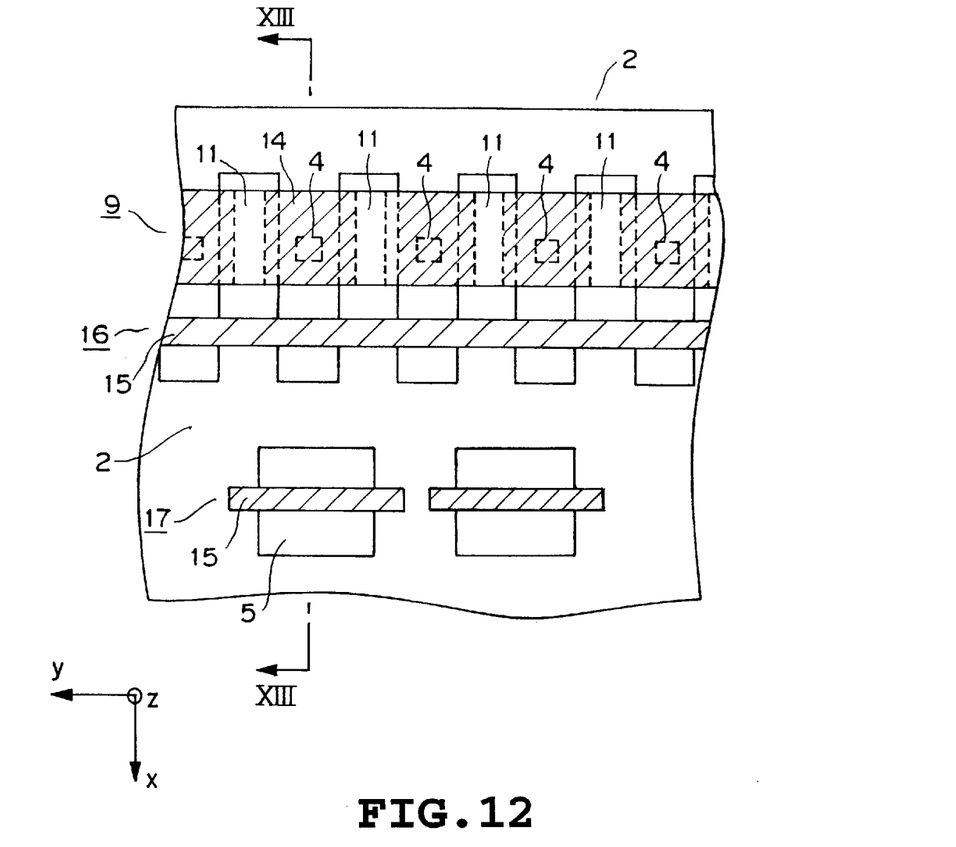
FIG. 12 is a top view of a semiconductor device manufactured by the first embodiment of the present invention in which a control gate portion is used as a mask.
Figure 13:
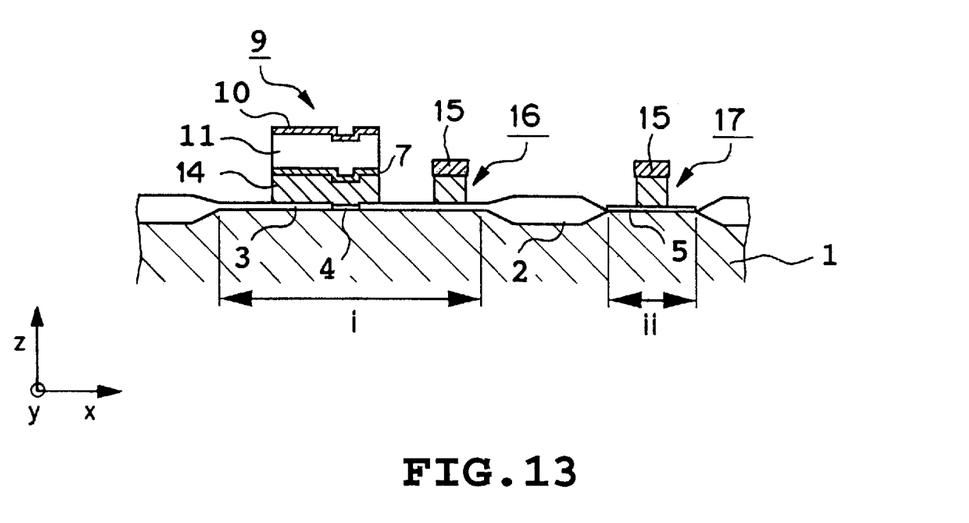
FIG. 13 is a sectional view taken on line XIII—XIII shown in FIG. 12.

In order to form the floating gate 14 of the nonvolatile memory cell in self-alignment manner, the floating gate 14 can also be formed by etching the polysilicon layer 6 using the control gate portion (namely, the first insulation layer 7, the control gate 11, and the second insulation film 10) in FIG. 9 as a mask. Also in this case, the selection gate electrode 16 of the nonvolatile memory cell and the gate electrode 17 of the MOS transistor can be formed simultaneously by the above-mentioned method. The top view of the thus-formed semiconductor device is shown in FIG. 12. FIG. 13 is a sectional view taken on line XIII—XIII shown in FIG. 12.

As stated above, according to the present invention, the gate oxide film 5 of the MOS transistor can be formed thin along with the tunnel oxide film 4 of the stacked gate 9 of the nonvolatile memory cell. Further, the floating gate 14 of the stacked gate 9 is formed in self-alignment manner. Thus, finely processing of the gate can be accomplished without increasing the number of steps.

The second embodiment of the present invention is illustrated with reference to FIGS. 14 to 23. This embodiment corresponds to the seventh and eighth aspects of the present invention, and it is an example for manufacturing a semiconductor device having a nonvolatile memory call of a stacked gate structure, a MOS transistor of a logic circuit, a resistance and a capacitor. Since formation of active regions lower than both a gate of the nonvolatile memory cell and a gate of the MOS transistor, that is, a channel, a source and a drain, are known, the description thereof is omitted.

Figure 14:
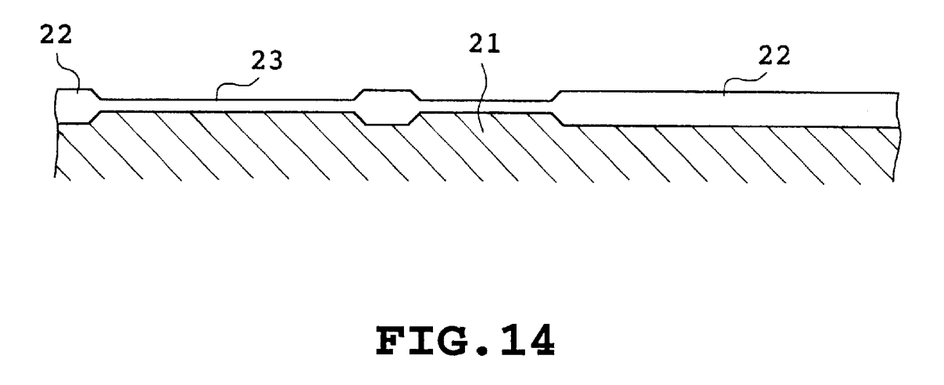
FIG. 14 is a sectional view showing that a field oxide and a gate oxide film are formed on a semiconductor substrate 21.

FIG. 14 is a sectional view showing that a field oxide and a gate oxide film were formed on a semiconductor substrate 21. A field oxide 22 having a thickness of 450 nm and a thick gate oxide film 23 having a thickness of 41.5 nm were formed on the surface of the semi-conductor substrate 21 by thermal oxidation. At this stage, a source and a drain of a stacked gate, and channel regions of the stacked gate, a selection gate, and the MOS transistor are already formed, though these are not shown in the drawing.

Figure 15:
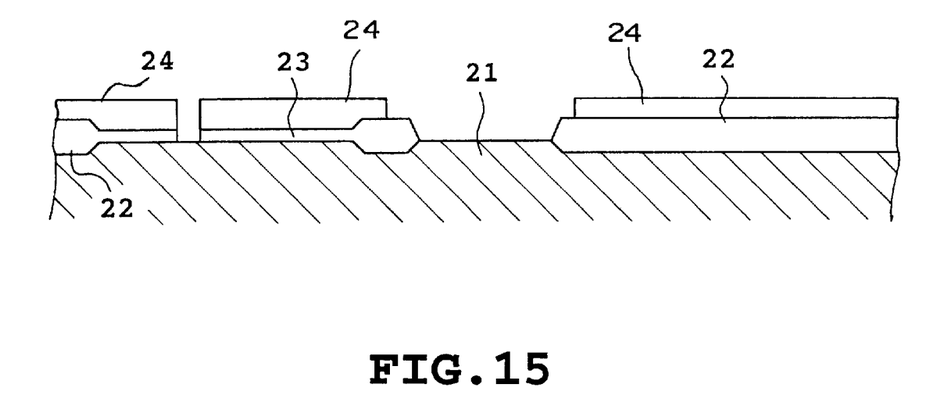
FIG. 15 is a sectional view showing that a gate oxide film 23 in portions corresponding to a stacked gate of a nonvolatile memory cell and a gate of a MOS transistor of a logic circuit is removed using a photoresist.

FIG. 15 is a sectional view showing that the gate oxide film 23 in portions corresponding to the stacked gate of the nonvolatile memory cell and the gate of the MOS transistor of the logic circuit was removed using a photoresist. The thick gate oxide film 23 in portions corresponding to the portions of the tunnel oxide film 25a of the stacked gate of the nonvolatile memory cell and the gate oxide film 25b of the MOS transistor of the logic circuit were removed by wet etching using a photoresist 24.

Figure 16:
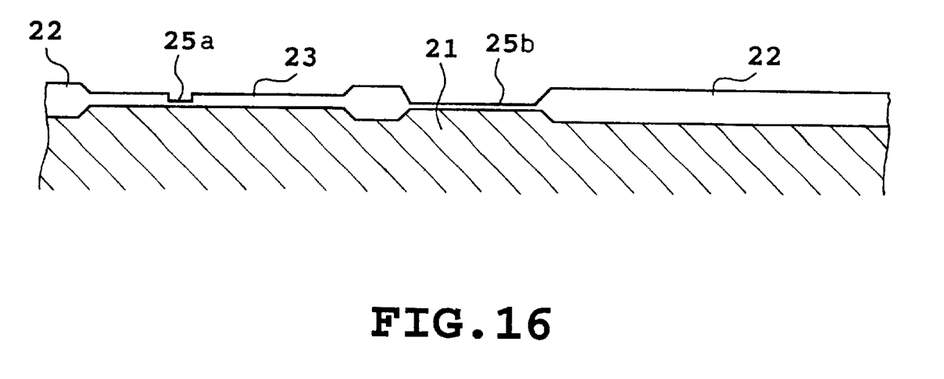
FIG. 16 is a sectional view in which a tunnel oxide film 25a of the stacked gate of the nonvolatile memory cell and a gate oxide film 25b of a portion corresponding to the gate of the MOS transistor of the logic circuit are formed.
Figure 17:
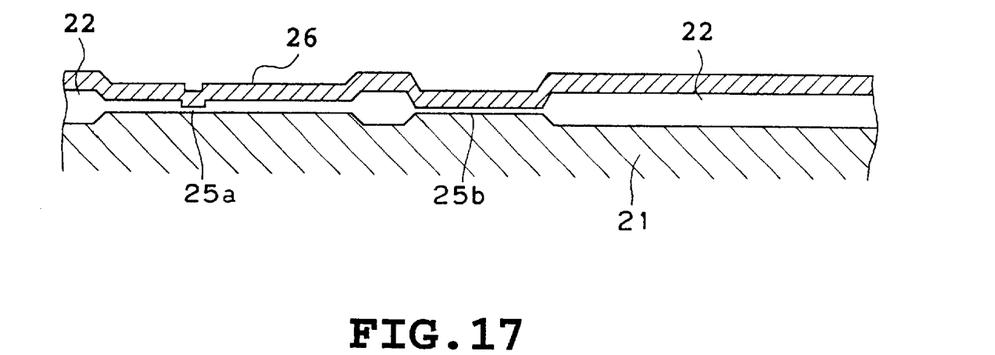
FIG. 17 is a sectional view showing a stage in which a polysilicon layer 26 doped with phosphorus is formed on the whole surface of the substrate to give a first conductive layer.

FIG. 16 is a sectional view in which the tunnel oxide film 25a of the stacked gate of the nonvolatile memory cell and the gate oxide film 25b of the portion corresponding to the gate of the MOS transistor of the logic circuit were formed. The resist 24 was removed, a necessary cleaning step was conducted, and the tunnel oxide film 25a and the gate oxide film 25b of the MOS transistor were formed by thermal oxidation, wherein each film has a thickness of 10 nm. As shown in FIG. 17, a polysilicon layer 26 having a thickness of 250 nm was formed on the whole surface of the oxide film by CVD, and a predetermined conductivity was imparted to the polysilicon layer 26 by doping the same with phosphorus to form a first conductive layer. At this time, a phosphate glass formed was removed with a hydrofluoric acid solution. Subsequently, as described earlier, a predetermined portion of the polysilicon layer 26 was removed by dry etching to separate the floating gate.

Figure 18:
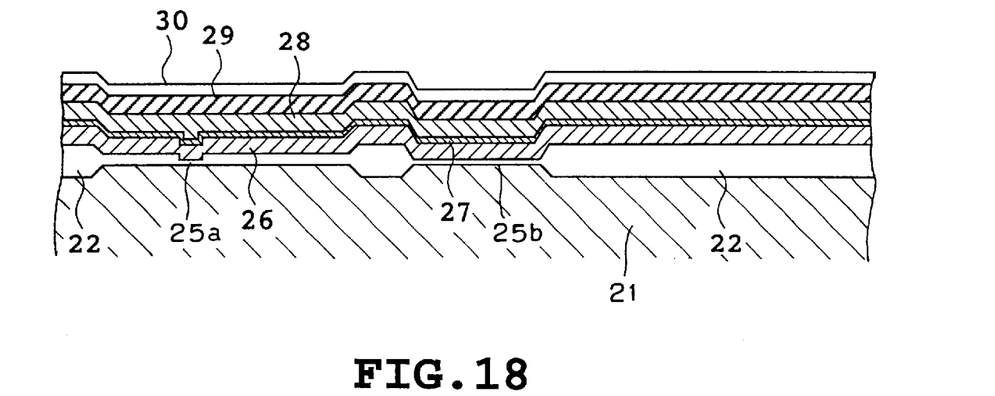
FIG. 18 is a sectional view showing a stage in which an ONO film 27 consisting of $SiO_2/Si_3N_4/SiO_2$ three layers is formed on the whole surface of the substrate.

Then, as shown in FIG. 18, an ONO film 27 consisting of three layers of $SiO_2$ having a thickness of 10 nm, $Si_3N_4$ having a thickness of 10 nm, and $SiO_2$ having a thickness of 5 nm, was formed on the whole surface, in which $SiO_2$ was formed by thermal oxidation and $Si_3N_4$ by CVD. A polysilicon layer 28 having a thickness of 250 nm was formed thereon, and doped with phosphorus to impart a predetermined conductivity. In this manner, a second conductive layer was provided. At this time, a phosphate glass formed on the surface was removed with a hydrofluoric acid solution. After a necessary cleaning step was conducted, a metal silicide layer, a tungsten (W) silicide layer 29 in this example, was formed on the polysilicon layer 28 to a thickness of 150 nm by sputtering. Further, an $SiO_2$ film 30 having a thickness of 230 nm was formed thereon by CVD (hereinafter, this is referred to as a "CVD $SiO_2$ film").

Figure 19:
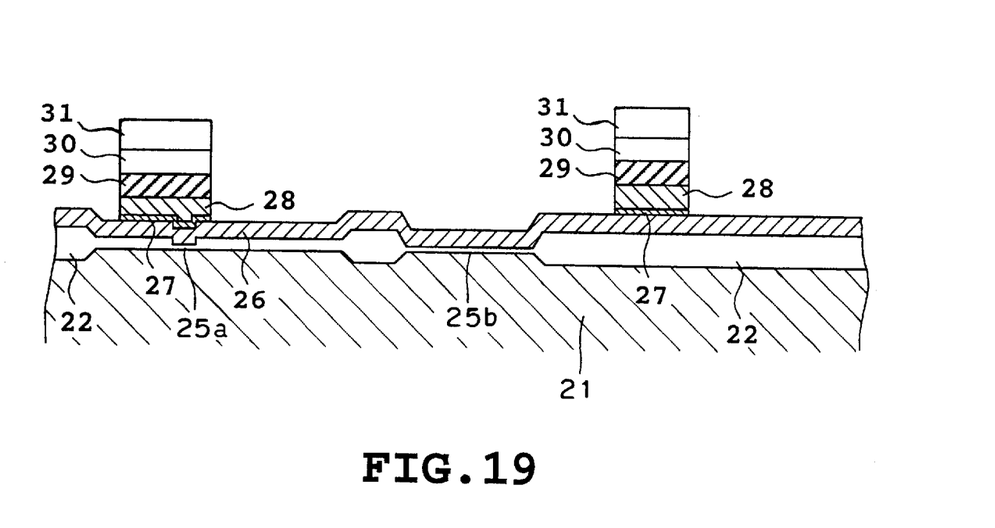
FIG. 19 is a sectional view showing a stage in which, after forming photoresist 31, predetermined positions, a CVD $SiO_2$ film 30, a tungsten(W) silicide layer 29, a polysilicon layer 28, and the ONO film 27 are removed by dry etching to form the stacked gate of the nonvolatile memory cell and a capacitor.
Figure 20:
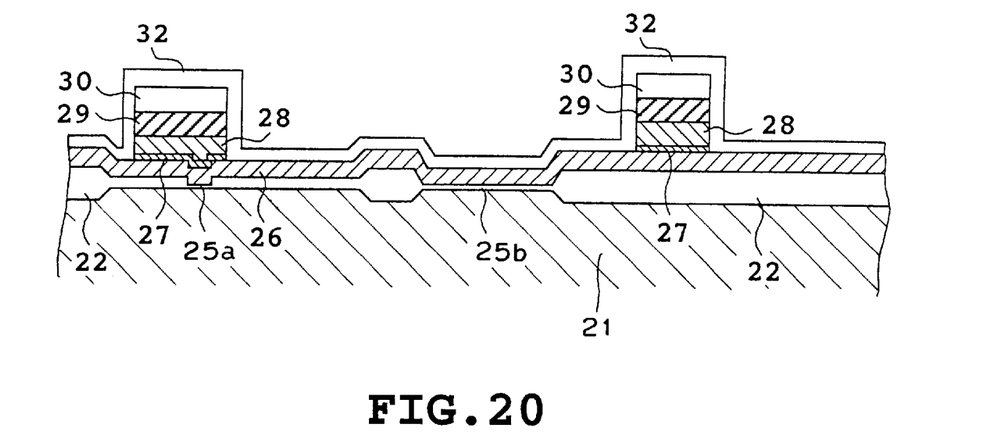
FIG. 20 is a sectional view showing a stage in which a CVD $SiO_2$ film 32 is formed on the whole surface of the substrate.

As shown in FIG. 19, in order to form a stacked gate of the nonvolatile memory cell and the capacitor, a photoresist 31 was formed in a predetermined position, and the CVD $SiO_2$ film 30, the W silicide layer 29, the polysilicon layer 28, and the ONO film 27 were removed by dry etching. At this stage, the upper structure of the stacked gate and the laminated structure for the capacitor were formed. Subsequently, the photoresist 31 was removed, and a CVD $SiO_2$ film 32, having a thickness of 170 nm, was formed on the whole surface as shown in FIG. 20.

Figure 21:
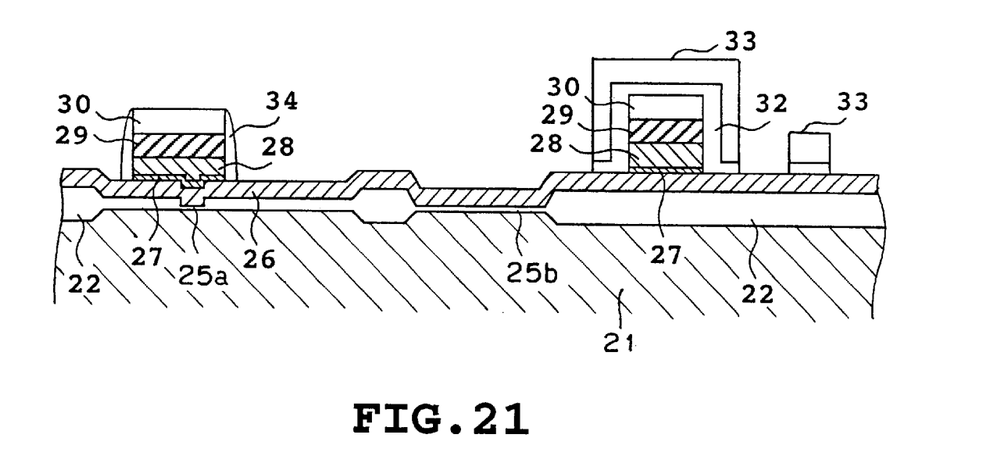
FIG. 21 is a sectional view showing a stage in which, after forming photoresist 33 on positions corresponding to the capacitor and a resistance, the CVD $SiO_2$ film 32 is removed by dry etching to form a side wall 34 on a side of an upper structure of the stacked gate portion.

As shown in FIG. 21, photoresists 33 were formed on positions corresponding to the capacitor and the resistance, and then the CVD $SiO_2$ film 32, was removed by dry etching. A side wall 34 was formed on the side of the upper structure of the stacked gate portion on which the CVD $SiO_2$ film 32 was exposed, while no side wall was formed on the capacitor portion and the resistance portion covered with the photoresists 33.

Figure 22:
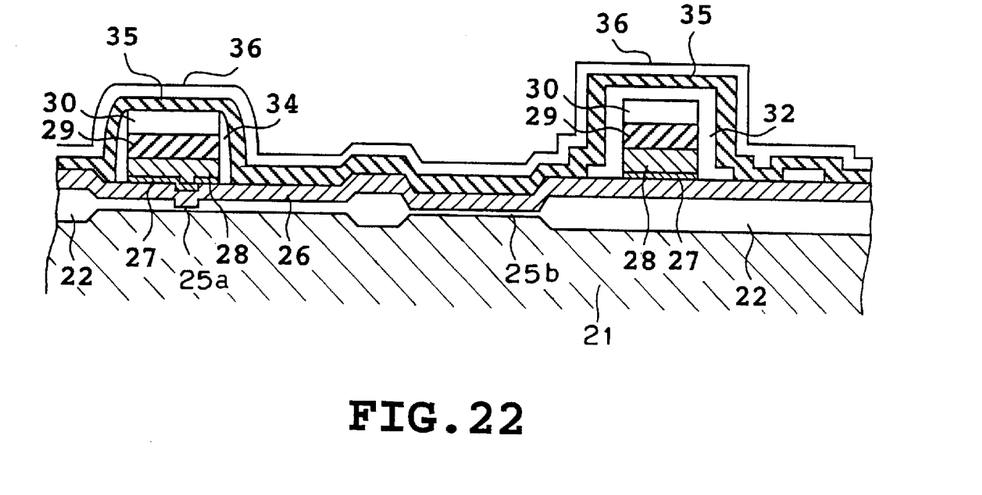
FIG. 22 is a sectional view showing a stage in which a metal silicide layer and a CVD $SiO_2$ layer 36 thereon are formed on the whole surface of the substrate.
Figure 23:
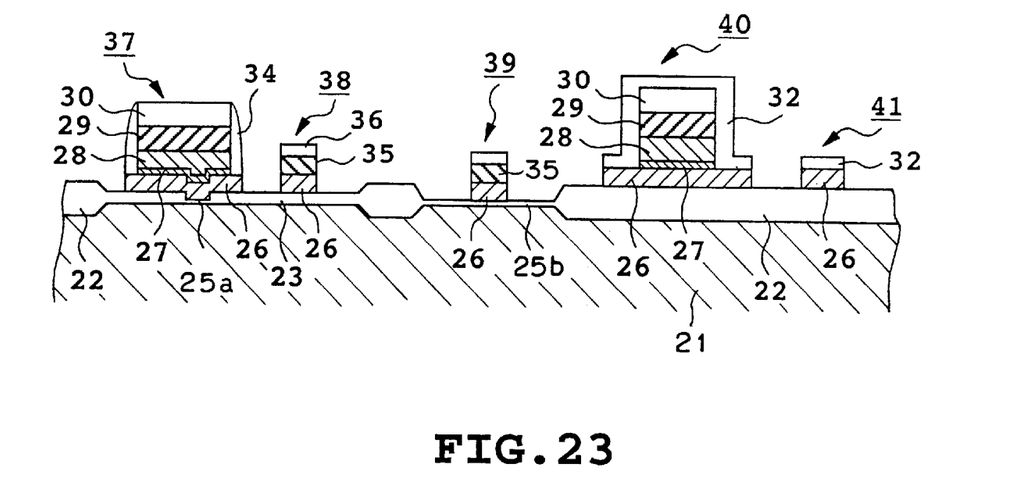
FIG. 23 is a sectional view showing a stage in which a floating gate is formed in self-alignment manner using the upper structure from the ONO film 27 upward and the side wall 34 formed on the side as a mask.

Thereafter, the photoresists were removed, and a necessary cleaning step was conducted. As shown in FIG. 22, a metal silicide layer, a W silicide layer 35 in this example, was formed on the whole surface to a thickness of 150 nm by sputtering, and a CVD $SiO_2$ layer 36 having a thickness of 230 nm was formed thereon by CVD. Finally, photoresists were formed in respective positions of the CVD $SiO_2$ film corresponding to the selection gate and the gate of the MOS transistor of the logic circuit, and the CVD $SiO_2$ film 36, the W silicide layer 35 and the polysilicon layer 26 except those under the photoresists were removed by dry etching, and the photoresists were removed. Consequently, as shown in FIG. 23, 1) the nonvolatile memory cell provided with the stacked gate 37 made of the polysilicon layer (floating gate) 26, the ONO film 27, the polysilicon layer (control gate) 28, the W suicide layer 29 and the CVD $SiO_2$ film 30 and the selection gate 38 made of the polysilicon layer 26, the W silicide layer 35 and the CVD $SiO_2$, film 36; and 2) the gate 39 of the MOS transistor made of the polysilicon layer 26, the W suicide layer 35 and the CVD $SiO_2$ film 36 were formed. Further, 3) the capacitor 40 made of the polysilicon layer 26, the ONO film 27, the polysilicon layer 28, the W silicide layer 29, the CVD $SiO_2$ film 30, and the CVD $SiO_2$ film 32; and 4) the resistance 41 made of the polysilicon layer 26 and the second CVD $SiO_2$ film 32 were formed at the same time.

Figure 24:
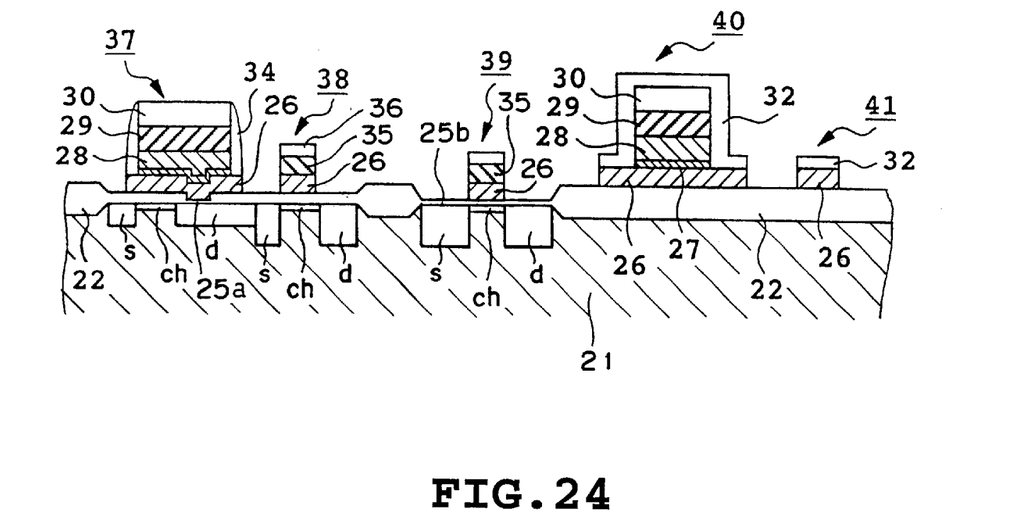
FIG. 24 is a sectional view of a semiconductor device formed by the second embodiment of the invention.

As shown by FIG. 23, the floating gate (polysilicon layer) 26 of the stacked gate 37 was formed in self-alignment manner using the upper structure from the ONO film 27 upward and the side wall 34 formed on the side portion as a mask. Further, the source and the drain of the selection gate and the MOS transistor were formed by the known method. The sectional view of the thus-formed semiconductor device is shown in FIG. 24. In FIG. 24, "ch" indicates a channel, "d" indicates a drain and "s" indicates a source, respectively. The construction of a channel, a source and a drain under each gate of the semiconductor device shown in FIG. 13, though not shown, is the same as in FIG. 24.

It is also possible to employ the third embodiment in which the metal silicide layer is omitted, in place of the second embodiment shown in FIGS. 14 to 23. The third embodiment corresponds to the ninth aspect of the present invention. In the third embodiment, in manufacturing the semiconductor device having the nonvolatile memory cell, the MOS transistor of the logic circuit, the resistance and the capacitor, the polysilicon layer 26, and the polysilicon layer 28 can be utilized as electrodes without using the metal silicide layers 29 and 35. That is, a laminated structure made of the polysilicon layer 26, the ONO film 27, the polysilicon layer 28, and the CVD $SiO_2$ layer 30 as shown in FIG. 25 is formed in each of positions corresponding to the nonvolatile memory cell, the MOS transistor, the capacitor, and the resistance without a step of forming the W silicide layers 29 and 35.

Figure 25:
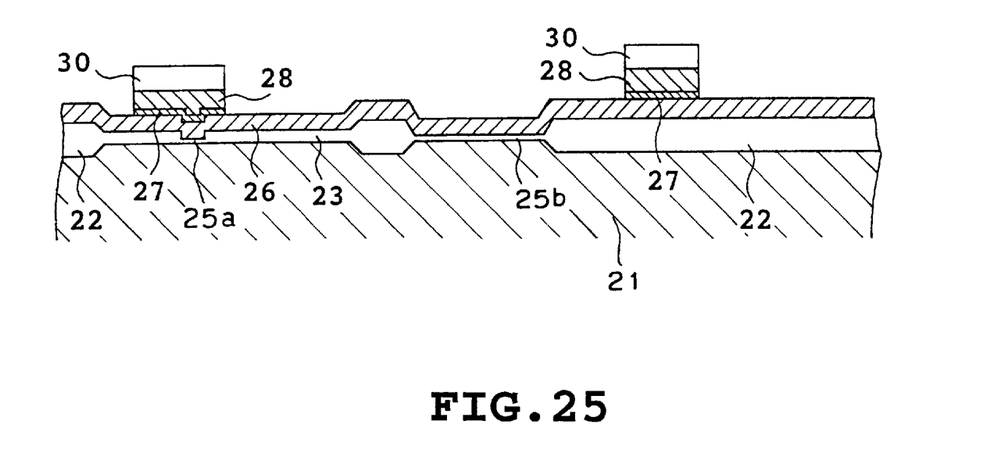
FIG. 25 is a sectional view showing a stage in which a laminated structure made of the polysilicon layer 26, the ONO film 27, the polysilicon layer 28, and the CVD $SiO_2$ film 30 is formed on positions corresponding to the nonvolatile memory cell, the MOS transistor, the capacitor and the resistance.
Figure 26:
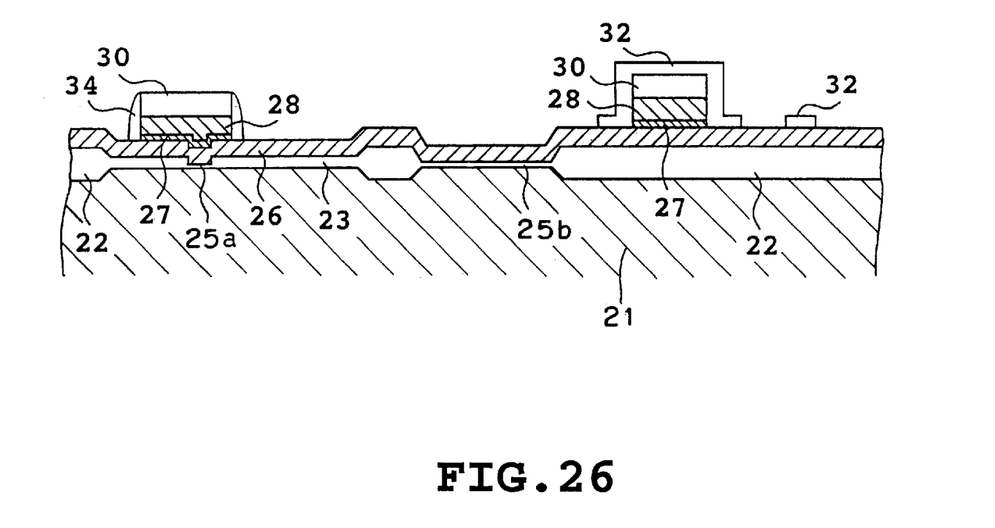
FIG. 26 is a sectional view showing a stage in which the whole surface is anisotropically etched upon leaving the CVD $SiO_2$ film 32 on the lower electrode region of the capacitor and the region of the resistance to form the side wall 34 on the side surface of the upper structure of the stacked gate.

FIG. 25 corresponds to the stage in FIG. 19 of the second embodiment. Subsequently, it is also possible that the CVD $SiO_2$ film 32 is formed on the whole structure. The whole structure is anisotropically etched as shown in FIG. 26 upon leaving the CVD $SiO_2$ film 32 of the lower electrode region of the capacitor and the region of the resistance to form the side wall 34 on the side surface of the upper structure of the stacked gate. FIG. 26 corresponds to the stage in FIG. 21 of the second embodiment. In this method as well, the floating gate can be formed in self-alignment manner. The subsequent steps are the same as in the second embodiment.

APPLICABILITY TO THE INDUSTRY

As has been discussed above, according to the present invention, the flatness of the surface is maintained in manufacturing the semiconductor device having the nonvolatile memory cell and the logic circuit, since the first conductive layer (polysilicon layer 6) remains except in the region in which the floating gate is separated. Consequently, the processing in the subsequent steps such as the step of etching the second conductive layer can be easily conducted, the dimensional accuracy can be increased, and the fine processing is enabled. Since no excess etching is needed in the etching of the gate electrode of the logic circuit, a finer gate electrode can be formed. Further, the tunnel oxide film of the stacked gate of the nonvolatile memory cell and the gate oxide film of the MOS transistor of the logic circuit can be formed thin, and the floating gate of the stacked gate can be formed in self-alignment manner. Therefore, it is possible to increase the dimensional accuracy of the semiconductor device comprising the nonvolatile memory cell such as EEPROM and the MOS transistor, and to improve the fineness of the processing. Still further, the number of steps is decreased, and an analog circuit is easily installed in combination since the MOS transistor, the resistance, and the capacitor of the stacked gate structure, and the single gate structure can be formed with the two conductive layers.

What is claimed is:

1. A method for manufacturing a semiconductor device comprising a nonvolatile memory transistor of a stacked gate structure having a floating gate and a control gate, and a MOS transistor of a single gate structure, said method comprising:

forming a first insulation film on a semiconductor substrate, said first insulation film becoming a gate oxide film of both the nonvolatile memory transistor and the MOS transistor;

forming a first conductive layer on the first insulation film;

removing the first conductive layer in an area extending in a direction perpendicular to a direction in which the control gate is formed extendedly from the first conductive layer to form a region for separating the floating gate;

forming a second insulation layer on the first conductive layer;

forming a second conductive layer so as to form the control gate;

patterning the second conductive layer on the second insulation film; and patterning the first conductive layer to form the stacked gate structure and the single gate structure, wherein the MOS transistor of the single gate structure includes a high-voltage transistor and forming a peripheral circuit, and wherein the step of forming the first insulation film comprises the steps of forming a gate insulation film of the high-voltage transistor, and forming a tunnel oxide film between the floating gate and the substrate and simultaneously forming a gate insulation film of the MOS transistor forming the peripheral circuit.

2. The method for manufacturing the semiconductor device as claimed in claim 1, wherein the floating gate is patterned in self-alignment manner using the second conductive layer constituting the control gate as a mask, in the step of patterning the first conductive layer to form the stacked gate structure.

3. The method for manufacturing the semiconductor device as claimed in claim 1, wherein the first conductive layer and the second conductive layer are made of polysilicon.

4. The method for manufacturing the semiconductor device as claimed in claim 1, further comprising a step of forming a side wall on the side surface of the control gate after patterning the second conductive layer.

5. The method for manufacturing the semiconductor device as claimed in claim 3, further comprising a step of forming a first metal silicide layer on the second conductive layer.

6. The method for manufacturing the semiconductor device as claimed in claim 5, further comprising the steps of:

forming a third insulation film on the first metal silicide layer;

removing the third insulation film, the first metal silicide layer, the second conductive layer, and the second insulation film, except the control gate portion of the stacked gate structure, to form the control gate portion;

forming a side wall on the control gate portion;

forming a second metal silicide layer on exposed portions of the first conductive layer and the third insulation film;

forming a fourth insulation film on the second metal silicide layer; and etching the first conductive layer using the control gate portion as a mask to form the stacked gate structure in self-alignment manner, while patterning the fourth insulation film, the second metal silicide layer and the first conductive layer to form the MOS transistor of the single gate structure.

7. A method for manufacturing a semiconductor device having a nonvolatile memory cell, a capacitor and/or a resistance, and a logic circuit, comprising the steps of:

simultaneously forming a tunnel oxide film of the memory cell and a gate oxide film of a MOS transistor of the logic circuit;

forming a first polysilicon layer on the whole surface of the oxide film;

removing a region of the first polysilicon layer for separating a floating gate of the memory cell;

forming a first insulation film on the first polysilicon layer;

forming a second polysilicon layer on the whole surface of the first insulation film;

forming a second insulation film on the second polysilicon layer;

removing the second insulation film, the second polysilicon layer, and the first insulation film, except the desired region of the memory cell and the upper electrode region of the capacitor;

forming a third insulation film on the whole surface;

removing the portions of the third insulation film except the lower electrode region of the capacitor and the region of the resistance; and anisotropically etching the whole surface to form a side wall of a stacked gate of the memory cell.

* * * * *